United States Patent
Wang et al.

(10) Patent No.: US 9,573,144 B2
(45) Date of Patent: Feb. 21, 2017

(54) COATING APPARATUS AND METHOD OF FORMING COATING FILM

(71) Applicant: Taiwan Semiconductor Manufacturing Co., Ltd., Hsin-Chu (TW)

(72) Inventors: Lan-Hai Wang, Zhubei (TW); Yong-Hung Yang, Hsinchu (TW); Ding-I Liu, Hsinchu (TW); Si-Wen Liao, Hsinchu (TW); Po-Hsiung Leu, Taoyuan County (TW); Mao-Cheng Lin, Changhua County (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 266 days.

(21) Appl. No.: 14/291,575

(22) Filed: May 30, 2014

(65) Prior Publication Data
US 2015/0348779 A1 Dec. 3, 2015

(51) Int. Cl.
| | | |
|---|---|---|
| H01L 21/31 | (2006.01) | |
| H01L 21/469 | (2006.01) | |
| B05B 1/30 | (2006.01) | |
| B05B 1/18 | (2006.01) | |
| B05C 11/08 | (2006.01) | |
| C23C 18/00 | (2006.01) | |
| H01L 21/67 | (2006.01) | |
| H01L 31/18 | (2006.01) | |

(52) U.S. Cl.
CPC ............... *B05B 1/30* (2013.01); *B05B 1/185* (2013.01); *B05C 11/08* (2013.01); *C23C 18/00* (2013.01); *H01L 21/6715* (2013.01); *H01L 21/67051* (2013.01); *H01L 31/18* (2013.01)

(58) Field of Classification Search
CPC .......... H01L 21/67051; H01L 21/6715; H01L 31/18; H01L 2933/0025
See application file for complete search history.

(56) References Cited

U.S. PATENT DOCUMENTS

| | | | | |
|---|---|---|---|---|
| 2003/0143315 | A1* | 7/2003 | Pui | A61L 31/16 427/2.1 |
| 2004/0069215 | A1* | 4/2004 | Lin | H01L 21/67051 118/52 |
| 2005/0146680 | A1* | 7/2005 | Muisener | B05C 11/08 351/159.27 |
| 2006/0112979 | A1* | 6/2006 | Kim | B08B 3/02 134/94.1 |
| 2007/0278103 | A1* | 12/2007 | Hoerr | A61L 27/34 205/80 |
| 2009/0191720 | A1* | 7/2009 | Nakagawa | G03F 7/162 438/782 |

(Continued)

*Primary Examiner* — Zandra Smith
*Assistant Examiner* — John M Parker
(74) *Attorney, Agent, or Firm* — McClure, Qualey & Rodack, LLP (57) ABSTRACT

A method of forming a coating film over a substrate is provided. The method includes spinning the substrate. The method further includes providing a central coating liquid spray over a central portion of the substrate. The method also includes providing first coating liquid sprays over the substrate. The first coating liquid sprays surround the central coating liquid spray and are spaced apart from the central coating liquid spray by a same first distance.

20 Claims, 6 Drawing Sheets

(56) References Cited

U.S. PATENT DOCUMENTS

| | | | |
|---|---|---|---|
| 2015/0151311 A1* | 6/2015 | Jung | B05D 1/005 |
| | | | 427/240 |
| 2015/0158051 A1* | 6/2015 | Hoerr | A61L 27/34 |
| | | | 427/2.1 |
| 2016/0056049 A1* | 2/2016 | Lin | H01L 21/30604 |
| | | | 510/176 |

* cited by examiner

COATING APPARATUS AND METHOD OF FORMING COATING FILM

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since the feature sizes continue to decrease, fabrication processes continue to become more difficult to perform. The fabrication processes include gap-filling processes, etching processes, photolithography processes, alignment processes, or the like. Therefore, it is a challenge to form reliable semiconductor devices with smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It is understood that additional operations can be provided before, during, and after the method, and some of the operations described can be replaced or eliminated for other embodiments of the method.

Figure 1A:
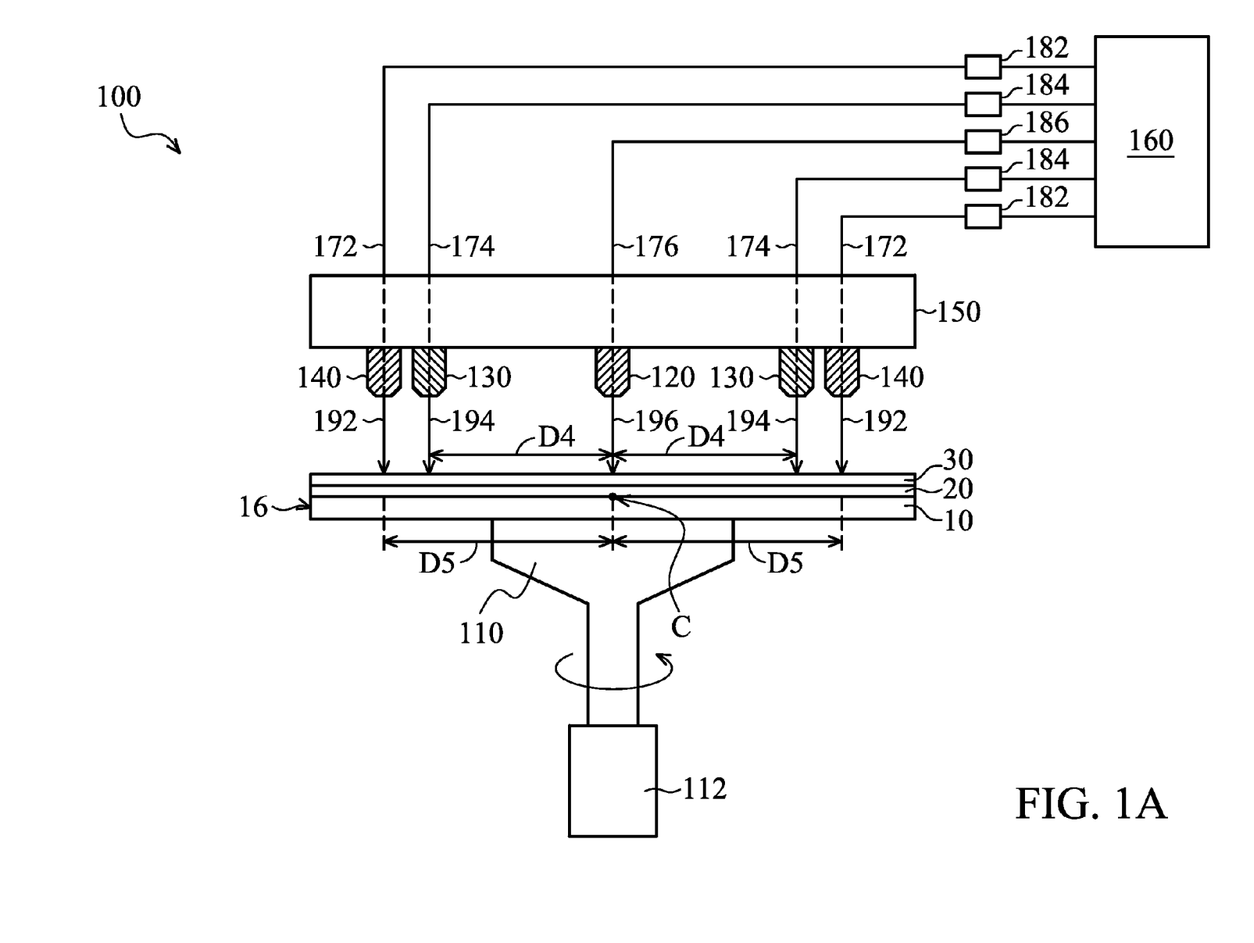
FIG. 1A is a side view of a coating apparatus, in accordance with some embodiments.

FIG. 1A is a side view of a coating apparatus, in accordance with some embodiments. As shown in FIG. 1A, a coating apparatus 100 includes a spin chuck 110, a central coating nozzle 120 and first coating nozzles 130. In some embodiments, the coating apparatus 100 further includes second coating nozzles 140.

The spin chuck 110 is configured to hold and rotate a substrate 10, in accordance with some embodiments. The substrate 10 includes a wafer or the like, in accordance with some embodiments. The substrate 10 is in a circular shape and has a radius R. In some embodiments, the spin chuck 110 is rotationally driven by a driving motor 112. The spin chuck 110 securely holds the substrate 10 by, for example, vacuum suction.

Figure 1B:
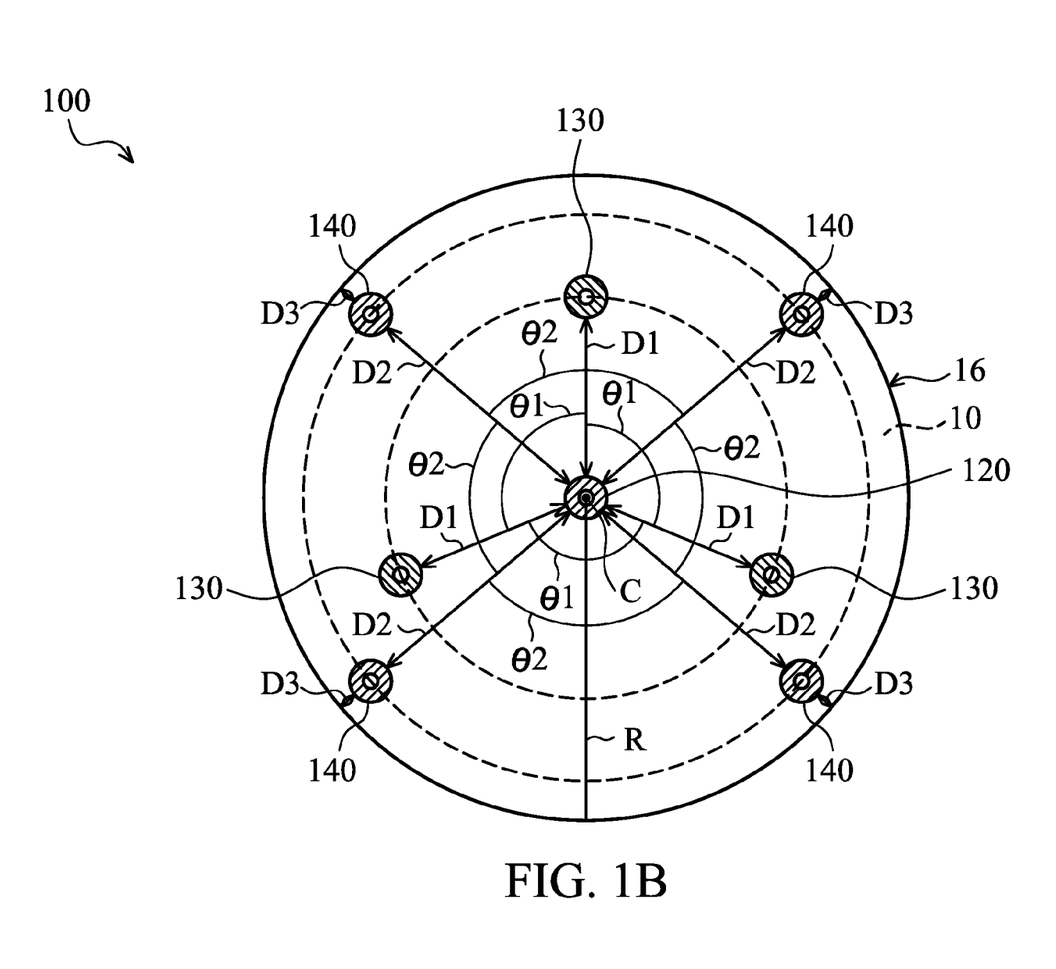
FIG. 1B is a top view of the central nozzle, the first nozzles, the second nozzles and the substrate of FIG. 1A, in accordance with some embodiments.
Figure 1C:
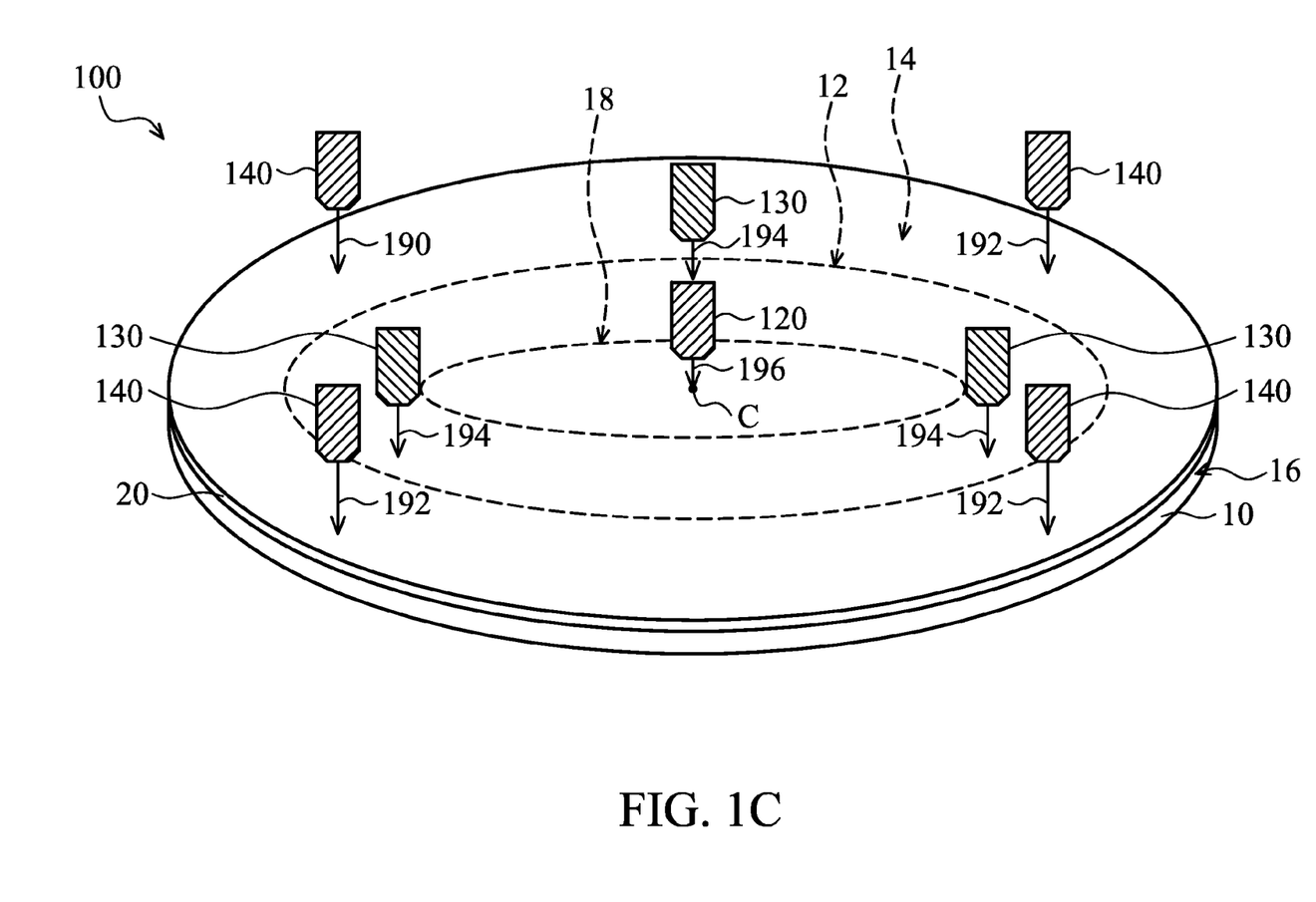
FIG. 1C is a perspective view of the central nozzle, the first nozzles, the second nozzles and the substrate of FIG. 1A, in accordance with some embodiments.

FIG. 1B is a top view of the central nozzle, the first nozzles, the second nozzles and the substrate of FIG. 1A, in accordance with some embodiments. FIG. 1C is a perspective view of the central nozzle, the first nozzles, the second nozzles and the substrate of FIG. 1A, in accordance with some embodiments.

As shown in FIGS. 1A-1C, the central coating nozzle 120 is located right over a central portion C of the substrate 10, in accordance with some embodiments. The central coating nozzle 120 is configured to provide a coating liquid to the substrate 10, in accordance with some embodiments. In some embodiments, the coating liquid includes a polymer material (e.g., an insulating material).

The first coating nozzles 130 surround the central coating nozzle 120 and are spaced apart from the central coating nozzle 120 by substantially a same first distance D1, in accordance with some embodiments. In some embodiments, the first coating nozzles 130 are arranged in a circular ring shape. In some embodiments, the first coating nozzles 130 are over a peripheral ring region 12 of the substrate 10. The first coating nozzles 130 are configured to provide the coating liquid to the substrate 10, in accordance with some embodiments.

In some embodiments, the number of first coating nozzles 130 is greater than two. For example, the number of first coating nozzles 130 is three. In some embodiments, the first coating nozzles 130 are at substantially a same angular distance $\theta 1$ from one another with respect to the central coating nozzle 120.

In some embodiments, if the number of first coating nozzles 130 is three, the angular distance $\theta 1$ is about 120°. In some embodiments, the first distance D1 between the first coating nozzle 130 and the central coating nozzle 120 is greater than a half of the radius R of the substrate 10.

In some embodiments, the second coating nozzles 140 surround the central coating nozzle 120. In some embodiments, the second coating nozzles 140 are spaced apart from the central coating nozzle 120 by substantially a same second distance D2. The second distance D2 is greater than the first distance D1. In some embodiments, the second coating nozzles 140 are arranged in a circular ring shape. In some embodiments, the second coating nozzles 140 are over an outermost peripheral ring region 14 of the substrate 10. The second coating nozzles 140 are configured to provide the coating liquid to the substrate 10, in accordance with some embodiments.

In some embodiments, the second coating nozzles 140 are at substantially a same angular distance θ 2 from one another with respect to the central coating nozzle 120. In some embodiments, the number of second coating nozzles 140 is greater than the number of first coating nozzles 130.

In some embodiments, the number of second coating nozzles 140 is four, and the number of first coating nozzles 130 is three. In some embodiments, if the number of second coating nozzles 140 is four, the angular distance θ 2 is about 90°. In some embodiments, the number of coating nozzles close to an edge 16 of the substrate 10 is greater than the number of coating nozzles close to the central portion C of the substrate 10.

In some embodiments, the ratio (D1/D2) of the first distance D1 to the second distance D2 is in a range from about 0.6 to about 0.9. In some embodiments, the first distance D1 is greater than the difference (D2−D1) between the second distance D2 and the first distance D1. In some embodiments, the difference (D2−D1) between the second distance D2 and the first distance D1 is greater than a distance D3 between the second coating nozzle 140 and the edge 16 of the substrate 10.

As shown in FIG. 1A, the coating apparatus 100 further includes a shower head 150, in accordance with some embodiments. The central coating nozzle 120, the first coating nozzles 130 and the second coating nozzles 140 are fixed to the shower head 150, in accordance with some embodiments. As shown in FIG. 1A, the coating apparatus 100 further includes a coating liquid supply source 160, in accordance with some embodiments.

The central coating nozzle 120 is connected to the coating liquid supply source 160 through one supply pipe 176, in accordance with some embodiments. The three first coating nozzles 130 are connected to the coating liquid supply source 160 through three supply pipes 174, respectively, in accordance with some embodiments. The four second coating nozzles 140 are connected to the coating liquid supply source 160 through four supply pipes 172, respectively, in accordance with some embodiments.

The supply pipes 172, 174 and 176 pass through the shower head 150, in accordance with some embodiments. It should be noted that FIG. 1A does not show all of the first coating nozzles 130, the second coating nozzles 140 and the supply pipes 172 and 174 due to the view angle.

The supply pipes 172, 174 and 176 are provided with flow control valves 182, 184 and 186, respectively, in accordance with some embodiments. The flow control valves 182, 184 and 186 control the timing of supplying the coating liquid and the flow rate of the coating liquid, in accordance with some embodiments. The central coating nozzle 120, the first coating nozzles 130 and the second coating nozzles 140 are controlled independently by controlling the flow control valves 182, 184 and 186, in accordance with some embodiments.

In some embodiments, a method of forming a coating film over the substrate 10 is provided as follows. As shown in FIG. 1A, the substrate 10 is held on the spin chuck 110, in accordance with some embodiments. In some embodiments, a film 20 is formed over the substrate 10. The film 20 includes metal, semiconductor oxide or other suitable materials. In some embodiments, the film 20 is not formed. Thereafter, the substrate 10 is rotated by the spin chuck 110, which is rotationally driven by the driving motor 112, in accordance with some embodiments.

In some embodiments, the flow control valve 186 is opened to provide a central coating liquid spray 196 to the substrate 10 via the central coating nozzle 120 to form a coating film 30. The coating film 30 includes, for example, silicon oxide. Afterwards, the flow control valves 184 are opened to provide first coating liquid sprays 194, in accordance with some embodiments.

Thereafter, the valves 182 are opened to provide second coating liquid sprays 192, in accordance with some embodiments. In some embodiments, the central coating liquid spray 196, the first coating liquid sprays 194 and the second coating liquid sprays 192 provide the same coating liquid. In some embodiments, the first coating liquid sprays 194 and the second coating liquid sprays 192 are also referred to as peripheral coating liquid sprays.

In some embodiments, a flow time of the central coating liquid spray 196 is longer than a flow time of the first coating liquid spray 194. In some embodiments, a flow time of the first coating liquid spray 194 is longer than a flow time of the second coating liquid spray 192. That is, if the coating liquid spray is closer to the central portion C of the substrate 10, the flow time of the coating liquid spray is longer.

In some embodiments, a flow rate of the central coating liquid spray 196 is greater than that of the first coating liquid spray 194. In some embodiments, the flow rate of the first coating liquid spray 194 is greater than that of the second coating liquid spray 192. That is, if the coating liquid spray is closer to the central portion C of the substrate 10, the flow rate of the coating liquid spray is greater.

In some embodiments, a central coating liquid supply quantity of the central coating liquid spray 196 is greater than the sum of coating liquid supply quantities of the first coating liquid sprays 194. In some embodiments, the sum of coating liquid supply quantities of the first coating liquid sprays 194 is greater than the sum of coating liquid supply quantities of the second coating liquid sprays 192. That is, if the coating liquid sprays are closer to the edge of the substrate 10, the sum of the coating liquid supply quantities of the coating liquid sprays is less, in accordance with some embodiments.

In some embodiments, the central coating liquid supply quantity of the central coating liquid spray 196 is greater than the sum of coating liquid supply quantities of the first coating liquid sprays 194 and the second coating liquid sprays 192. In some embodiments, a ratio of the central coating liquid supply quantity of the central coating liquid spray 196 to the sum of coating liquid supply quantities of the first coating liquid sprays 194 and the second coating liquid sprays 192 ranges from about 2 to about 9.

If the ratio is less than 2, the central coating liquid supply quantity of the central coating liquid spray 196 may be too small, and therefore the coating film 30 formed in a central region 18 of the substrate 10 may be too thin. If the ratio is greater than 9, the sum of coating liquid supply quantities of the first coating liquid sprays 194 and the second coating liquid sprays 192 may be too small, and the coating film 30 formed in the peripheral ring region 12 and the outermost peripheral ring region 14 of the substrate 10 may be non-uniform.

In some embodiments, the first coating liquid sprays 194 surround the central coating liquid spray 196 and are spaced apart from the central coating liquid spray 196 by substantially a same distance D4. In some embodiments, the second coating liquid sprays 192 surround the central coating liquid spray 196 and are spaced apart from the central coating liquid spray 196 by substantially a same distance D5. In some embodiments, the distance D5 is greater than the distance D4.

In some embodiments, the number of second coating liquid sprays 192 is greater than the number of the first coating liquid sprays 194. In some embodiments, the number of coating liquid sprays close to the edge of the substrate 10 is greater than the number of coating liquid sprays close to the central portion C of the substrate 10.

As shown in FIGS. 1A-1C, the central coating liquid spray 196, the first coating liquid sprays 194 and the second coating liquid sprays 192 are right under the central coating nozzle 120, the first coating nozzles 130 and the second coating nozzles 140, respectively. Therefore, the first coating liquid sprays 194 are at substantially the same angular distance θ1 from one another with respect to the central coating liquid spray 196. In some embodiments, the second coating liquid sprays 192 are at substantially the same angular distance θ2 from one another with respect to the central coating liquid spray 196.

In some embodiments, the coating liquid, used to form the coating film 30, has a viscosity higher than that of a photoresist material. The viscosity of the coating liquid is in a range from about 1 cP to about 2 cP. Since the viscosity of the coating liquid is high, the rotation speed of the spin chuck 110 is high enough to uniformly spread out the coating liquid over the substrate 10. In some embodiments, the rotation speed of the spin chuck 110 ranges from about 2000 rpm to about 3000 rpm.

Since the rotation speed is high, the coating liquid over the peripheral ring region 12 and the outermost peripheral ring region 14 of the substrate 10 may be affected by an air shear stress and be easily spun off the substrate 10. In some embodiments, the first and the second coating nozzles 130 and 140 provide a little amount of coating liquid to the peripheral ring region 12 and the outermost peripheral ring region 14 of the substrate 10 to compensate for the loss of the coating liquid from the central coating nozzle 120. Therefore, the first coating nozzles 130 and the second coating nozzles 140 may improve the uniformity of the thickness of the coating film 30.

Figure 2:
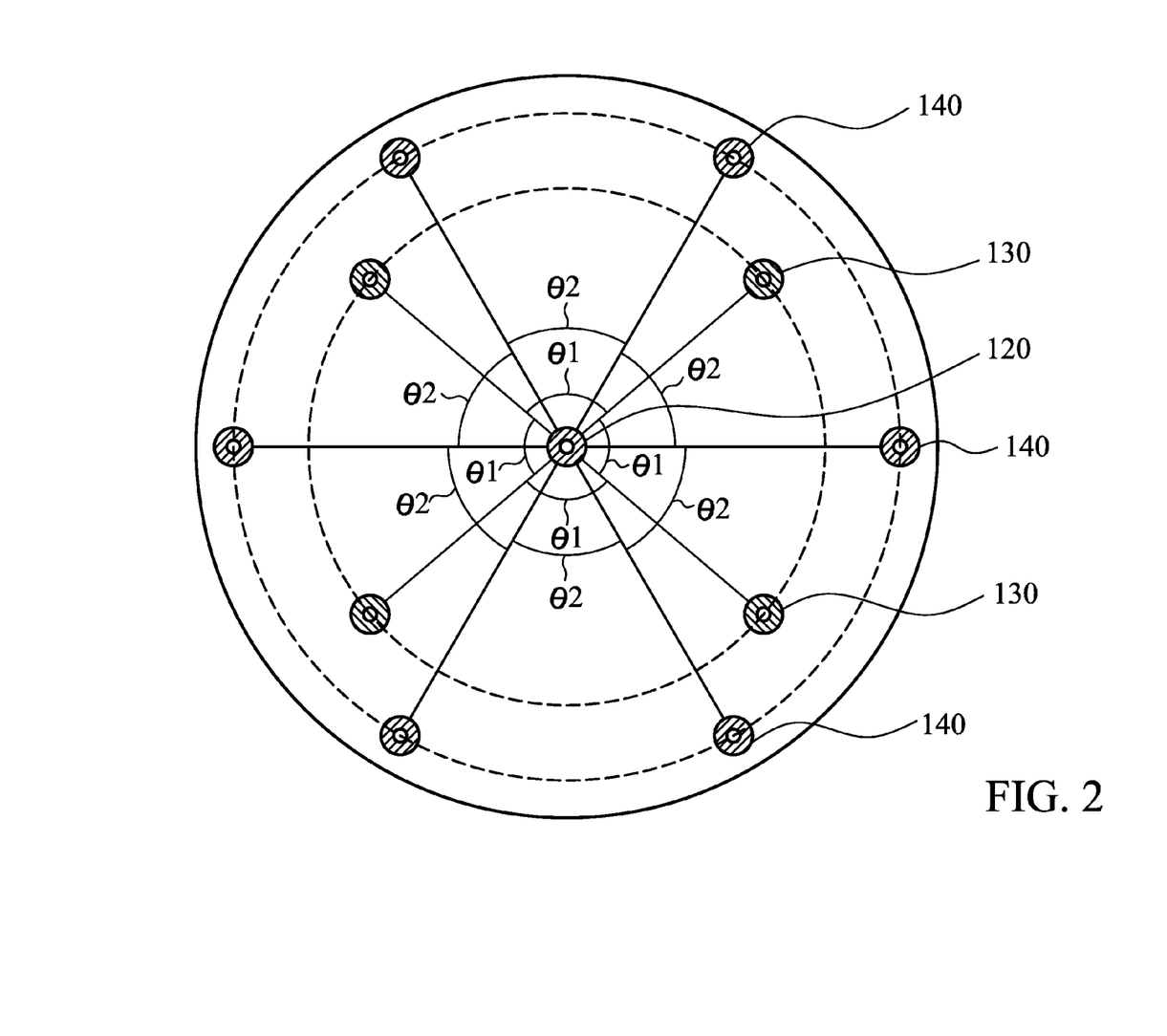
FIG. 2 is a top view of a central nozzle, first nozzles, second nozzles and a substrate, in accordance with some embodiments.

FIG. 2 is a top view of a central nozzle, first nozzles, second nozzles and a substrate, in accordance with some embodiments. As shown in FIG. 2, in some embodiments, the number of first coating nozzles 130 is four. In some embodiments, the first coating nozzles 130 are at substantially the same angular distance θ1 from one another with respect to the central coating nozzle 120. In some embodiments, the number of first coating nozzles 130 is four, and the angular distance θ1 is about 90°.

In some embodiments, the second coating nozzles 140 are at substantially the same angular distance θ2 from one another with respect to the central coating nozzle 120. In some embodiments, the number of second coating nozzles 140 is greater than the number of first coating nozzles 130.

In some embodiments, the number of second coating nozzles 140 is six, and the number of first coating nozzles 130 is four. In some embodiments, the number of second coating nozzles 140 is six, and the angular distance θ2 is about 60°. In some embodiments, the first coating nozzles 130 and the second coating nozzles 140 are also referred to as peripheral coating nozzles.

Figure 3:
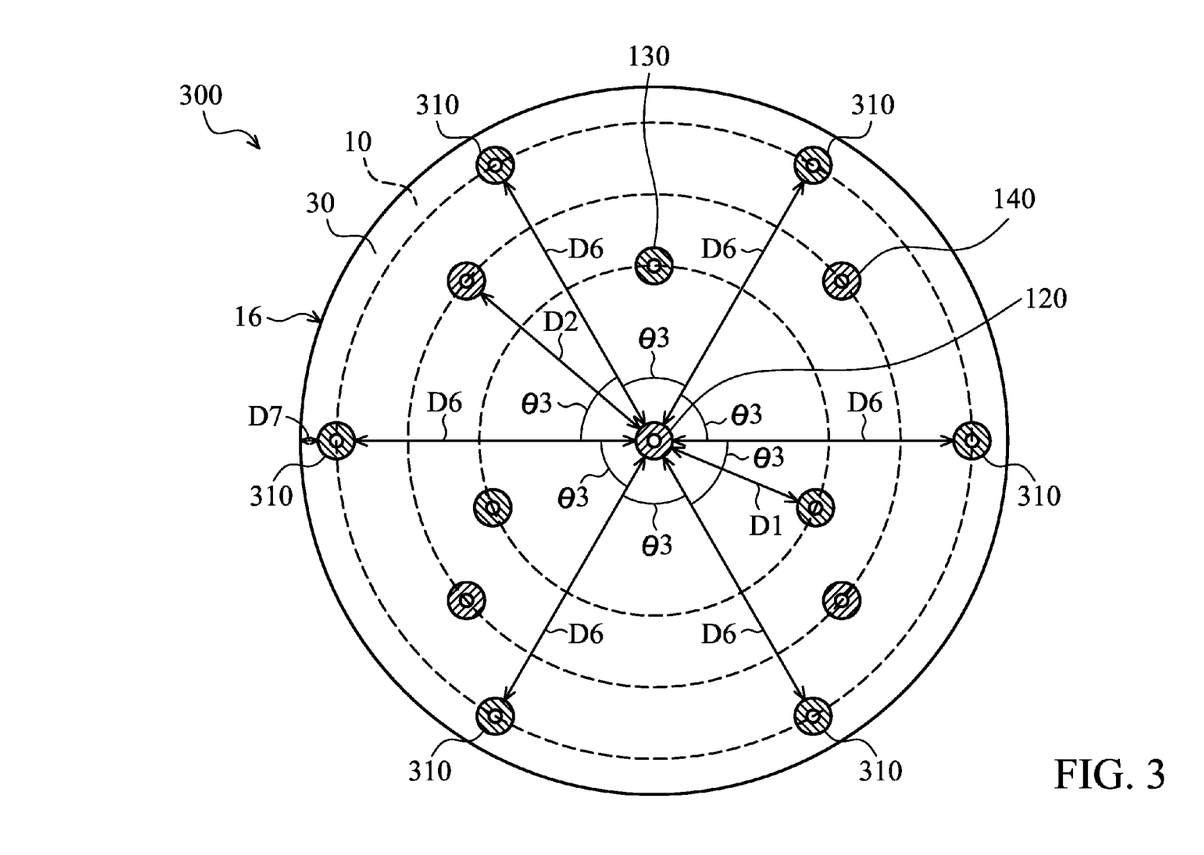
FIG. 3 is a top view of a central nozzle, first nozzles, second nozzles, third nozzles and a substrate, in accordance with some embodiments.

FIG. 3 is a top view of a central nozzle, first nozzles, second nozzles, third nozzles and a substrate, in accordance with some embodiments. As shown in FIG. 3, in some embodiments, a coating apparatus 300 is similar to the coating apparatus 100 of FIGS. 1A-1C, except that the coating apparatus 300 further includes third coating nozzles 310.

The third coating nozzles 310 surround the central coating nozzle 120 and are spaced apart from the central coating nozzle 120 by substantially the same distance D6, in accordance with some embodiments. In some embodiments, the third coating nozzles 310 are arranged in a circular ring shape.

In some embodiments, the number of third coating nozzles 310 is greater than the number of second coating nozzles 140. In some embodiments, the number of third coating nozzles 310 is six. In some embodiments, the third coating nozzles 310 are at substantially the same angular distance θ3 from one another with respect to the central coating nozzle 120.

In some embodiments, the first distance D1 is greater than the difference (D2-D1) between the second distance D2 and the first distance D1. In some embodiments, the difference (D2-D1) between the second distance D2 and the first distance D1 is greater than the difference (D6-D2) between the distance D6 and the second distance D2. In some embodiments, the difference (D6-D2) between the distance D6 and the second distance D2 is greater than a distance D7 between the third coating nozzle 310 and the edge 16 of the substrate 10.

Figure 4:
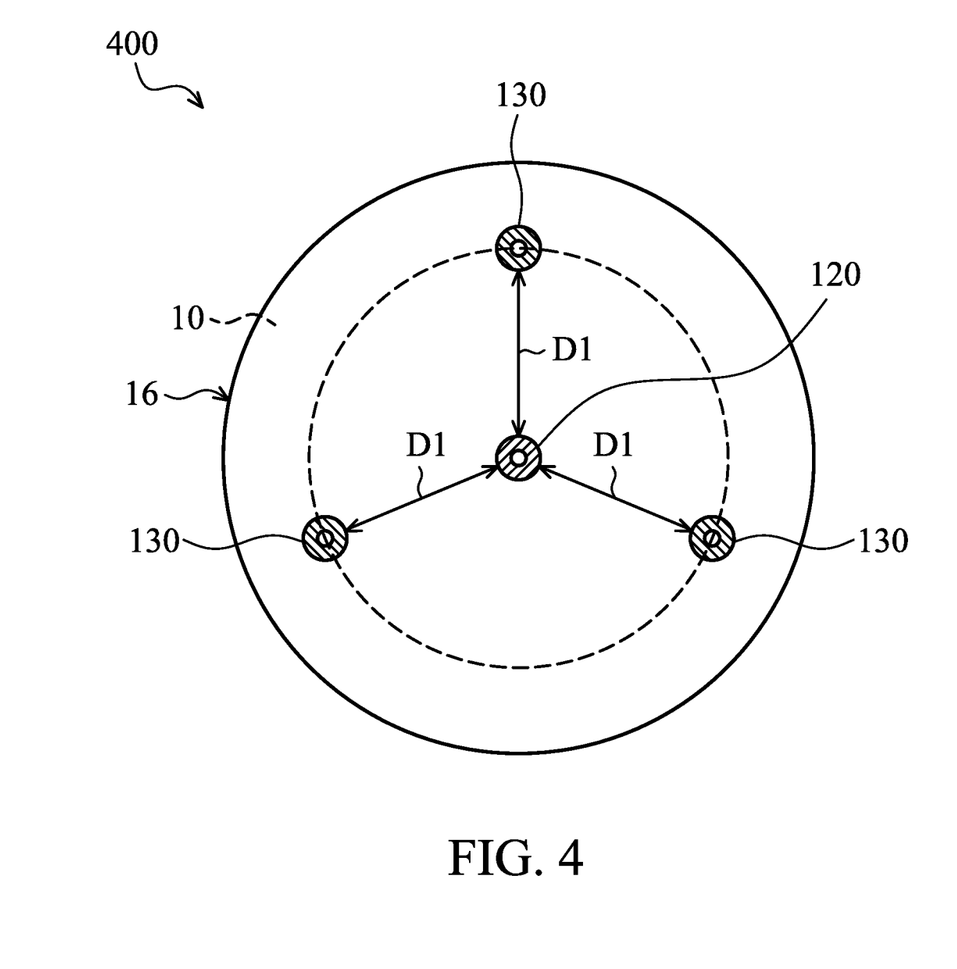
FIG. 4 is a top view of a central nozzle, first nozzles and a substrate, in accordance with some embodiments.

FIG. 4 is a top view of a central coating nozzle, first coating nozzles and a substrate, in accordance with some embodiments. As shown in FIG. 4, in some embodiments, a coating apparatus 400 is similar to the coating apparatus 100 of FIGS. 1A-1C, except that the coating apparatus 400 does not have the second coating nozzles 140.

In accordance with some embodiments, coating apparatuses and methods for forming a coating film are provided. The methods provide peripheral coating liquid sprays over peripheral regions of a substrate, which is to be spin-coated, to compensate for the loss of a coating liquid over peripheral regions from a central coating liquid spray. Therefore, the peripheral coating liquid sprays may improve the uniformity of the thickness of the formed coating film.

In accordance with some embodiments, a method of forming a coating film over a substrate is provided. The method includes spinning the substrate. The method further includes providing a central coating liquid spray over a central portion of the substrate. The method also includes providing first coating liquid sprays over the substrate. The first coating liquid sprays surround the central coating liquid spray and are spaced apart from the central coating liquid spray by substantially a same first distance.

In accordance with some embodiments, a method of forming a coating film over a substrate is provided. The method includes spinning the substrate. The method further includes providing a central coating liquid spray over a central portion of the substrate. The method also includes providing first coating liquid sprays over the substrate. The first coating liquid sprays surround the central coating liquid spray and are spaced apart from the central coating liquid spray by substantially a same first distance. A central coating liquid supply quantity of the central coating liquid spray is greater than the sum of coating liquid supply quantities of the first coating liquid sprays.

In accordance with some embodiments, a coating apparatus for forming a coating film over a substrate is provided. The coating apparatus includes a spin chuck for holding the substrate. The coating apparatus further includes a central coating nozzle over a central portion of the substrate. The coating apparatus also includes first coating nozzles surrounding the central coating nozzle and spaced apart from the central coating nozzle by substantially a same first distance.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a coating film over a substrate, comprising:
    spinning the substrate;
    providing a central coating liquid spray over a central portion of the substrate;
    providing a plurality of first coating liquid sprays over the substrate, wherein the first coating liquid sprays surround the central coating liquid spray and are spaced apart from the central coating liquid spray by substantially a same first distance; and
    providing a plurality of second coating liquid sprays on the substrate, wherein the second coating liquid sprays surround the central coating liquid spray and are spaced apart from the central coating liquid spray by substantially a same second distance, wherein the second distance is greater than the first distance.

2. The method of forming a coating film over a substrate as claimed in claim 1, wherein the providing of the first coating liquid sprays is performed after the providing of the central coating liquid spray.

3. The method of forming a coating film over a substrate as claimed in claim 1, wherein a flow time of the central coating liquid spray is longer than a flow time of the first coating liquid spray.

4. The method of forming a coating film over a substrate as claimed in claim 1, wherein the providing of the central coating liquid spray, the providing of the first coating liquid sprays, and the providing of the second coating liquid sprays are performed sequentially.

5. The method of forming a coating film over a substrate as claimed in claim 1, wherein a flow time of the central coating liquid spray is longer than a flow time of the first coating liquid spray, and the flow time of the first coating liquid spray is longer than a flow time of the second coating liquid spray.

6. The method of forming a coating film over a substrate as claimed in claim 1, wherein a flow rate of the central coating liquid spray is greater than a flow rate of the first coating liquid spray.

7. The method of forming a coating film over a substrate as claimed in claim 6, wherein the flow rate of the first coating liquid spray is greater than a flow rate of the second coating liquid spray.

8. The method of forming a coating film over a substrate as claimed in claim 1, wherein a flow rate of the central coating liquid spray is greater than a flow rate of the first coating liquid spray.

9. A method of forming a coating film over a substrate, comprising:
    spinning the substrate;
    providing a central coating liquid spray over a central portion of the substrate;
    providing a plurality of first coating liquid sprays over the substrate, wherein the first coating liquid sprays surround the central coating liquid spray and are spaced apart from the central coating liquid spray by substantially a same first distance, and a central coating liquid supply quantity of the central coating liquid spray is greater than a sum of coating liquid supply quantities of the first coating liquid sprays; and
    providing a plurality of second coating liquid sprays on the substrate, wherein the second coating liquid sprays surround the central coating liquid spray and are spaced apart from the central coating liquid spray by substantially a same second distance, and the second distance is greater than the first distance.

10. The method of forming a coating film over a substrate as claimed in claim 9, wherein the sum of coating liquid supply quantities of the first coating liquid sprays is greater than a sum of coating liquid supply quantities of the second coating liquid sprays.

11. The method of forming a coating film over a substrate as claimed in claim 9, wherein a ratio of the central coating liquid supply quantity of the central coating liquid spray to a sum of coating liquid supply quantities of the first coating liquid sprays and the second coating liquid sprays ranges from about 2 to about 9.

12. The method of forming a coating film over a substrate as claimed in claim 9, wherein the providing of the central coating liquid spray, the providing of the first coating liquid sprays, and the providing of the second coating liquid sprays are performed sequentially.

13. The method of forming a coating film over a substrate as claimed in claim 9, wherein a flow time of the central coating liquid spray is longer than a flow time of the first coating liquid spray, and the flow time of the first coating liquid spray is longer than a flow time of the second coating liquid spray.

14. The method of forming a coating film over a substrate as claimed in claim 9, wherein a flow rate of the central coating liquid spray is greater than a flow rate of the first coating liquid spray.

15. A method of forming a coating film over a substrate, comprising:
    spinning the substrate;
    providing a central coating liquid spray over a central portion of the substrate;
    providing a plurality of first coating liquid sprays over the substrate, wherein the first coating liquid sprays surround the central coating liquid spray and are spaced apart from the central coating liquid spray by substantially a same first distance, and the first coating liquid sprays are at substantially a same first angular distance from one another with respect to the central coating liquid spray; and providing a plurality of second coating liquid sprays over the substrate, wherein the second coating liquid sprays surround the central coating liquid spray and are spaced apart from the central coating liquid spray by substantially a same second distance, and the second distance is greater than the first distance.

16. The method of forming a coating film over a substrate as claimed in claim 15, wherein the substrate is in a circular shape and has a radius, and the first distance is greater than a half of the radius.

17. The method of forming a coating film over a substrate as claimed in claim 15, wherein a first number of second coating liquid sprays is greater than a second number of the first coating liquid sprays.

18. The method of forming a coating film over a substrate as claimed in claim 15, wherein the second coating liquid sprays are at substantially a same second angular distance from one another with respect to the center coating liquid spray.

19. The method of forming a coating film over a substrate as claimed in claim 15, wherein a first flow rate of the central coating liquid spray is greater than a second flow rate of the first coating liquid spray, and the second flow rate of the first coating liquid spray is greater than a third flow rate of the second coating liquid spray.

20. The method of forming a coating film over a substrate as claimed in claim 15, wherein the first distance is greater than a difference between the second distance and the first distance.

* * * * *